(12) United States Patent
Ghaly et al.

(10) Patent No.: US 8,971,111 B2
(45) Date of Patent: Mar. 3, 2015

(54) THRESHOLD VOLTAGE CALIBRATION USING REFERENCE PATTERN DETECTION

(71) Applicant: Seagate Technology LLC, Cupertino, CA (US)

(72) Inventors: Mai A. Ghaly, Bloomington, MN (US); Rodney Virgil Bowman, Bloomington, MN (US)

(73) Assignee: Seagate Technology LLC, Cupertino, CA (US)

( * ) Notice: Subject to any disclaimer, the term of this patent is extended or adjusted under 35 U.S.C. 154(b) by 96 days.

(21) Appl. No.: 13/900,718

(22) Filed: May 23, 2013

(65) Prior Publication Data

US 2014/0347923 A1     Nov. 27, 2014

(51) Int. Cl.
*G11C 11/34*     (2006.01)
*G11C 16/34*     (2006.01)

(52) U.S. Cl.
CPC ................................. *G11C 16/3404* (2013.01)
USPC .................................................... 365/185.03

(58) Field of Classification Search
USPC .................................................... 365/185.03
See application file for complete search history.

(56) References Cited

U.S. PATENT DOCUMENTS

| 7,903,468 | B2 | 3/2011 | Litsyn et al. |
| 2003/0021149 | A1* | 1/2003 | So et al. ................... 365/185.03 |
| 2004/0187050 | A1* | 9/2004 | Baumann et al. ............. 714/704 |
| 2008/0175054 | A1* | 7/2008 | Hancock et al. ......... 365/185.09 |
| 2010/0118608 | A1 | 5/2010 | Song et al. |
| 2011/0038212 | A1 | 2/2011 | Uchikawa et al. |
| 2011/0141827 | A1 | 6/2011 | Mozak et al. |
| 2011/0182118 | A1 | 7/2011 | Litsyn et al. |
| 2011/0194348 | A1* | 8/2011 | Mokhlesi et al. ........ 365/185.03 |
| 2013/0024742 | A1* | 1/2013 | Nazarian et al. .............. 714/758 |
| 2013/0094288 | A1 | 4/2013 | Patapoutian et al. |
| 2014/0258796 | A1* | 9/2014 | Ghaly et al. ................... 714/708 |

FOREIGN PATENT DOCUMENTS

WO    WO2011008367    1/2011
WO    WO2011094454    8/2011

\* cited by examiner

*Primary Examiner* — Hoai V Ho
*Assistant Examiner* — Pablo Huerta
(74) *Attorney, Agent, or Firm* — Hollingsworth Davis, LLC

(57)     ABSTRACT

A memory controller identifies a predominant type of error of a memory unit of solid state memory cells. An error type differential is calculated. The error type differential is a difference between a number of charge loss errors and a number of charge gain errors of the memory unit. A $V_T$ offset error differential is calculated. The $V_T$ offset error differential is a difference between a number of errors of the predominant type at a first $V_T$ offset and a number of errors of the predominant type at a second $V_T$ offset. A $V_T$ offset is determined using a ratio of the error type differential and the $V_T$ offset error differential.

20 Claims, 9 Drawing Sheets

| Write/Read | PE | 11 | 01 | 00 | 10 |
|---|---|---|---|---|---|
| 11 | | 0 | 40.126 | 0 | 0.0787 |
| 01 | 1K | 0.8655 | 0 | 39.103 | 0.0787 |
| 00 | | 0.1574 | 2.3603 | 0 | 13.533 |
| 10 | | 0.0787 | 0.3147 | 3.3045 | 0 |

Error Cause:
- 321 None
- 322 Charge Gain
- 323 Charge Loss
- 324 Complex

US 8,971,111 B2

THRESHOLD VOLTAGE CALIBRATION USING REFERENCE PATTERN DETECTION

TECHNICAL FIELD

This application relates generally to memory devices as well as articles and systems that incorporate such memory devices, and methods pertaining to such memory devices.

SUMMARY

Some embodiments are directed to a method comprising identifying a predominant type of error of a memory unit of solid state memory cells. An error type differential may be calculated. The error type differential comprises a difference between a number of charge loss errors and a number of charge gain errors of the memory unit. According to various implementations $V_T$ offset error differential is calculated. The $V_T$ offset error differential comprises a difference between a number of errors of the predominant type at a first $V_T$ offset and a number of errors of the predominant type at a second $V_T$ offset. A $V_T$ offset is determined using a ratio of the error type differential and the $V_T$ offset error differential.

According to various embodiments, a memory controller comprises a memory interface configured to receive data read from a unit of multi-level memory cells. In some cases the memory controller comprises decoder circuitry configured to determine errors in the data and a voltage threshold analyzer. The voltage threshold analyzer may be configured to identify a predominant type of error of a memory unit of solid state memory cells. According to some aspects, the voltage threshold analyzer is configured to calculate an error type differential, the error type differential comprising a difference between a number of charge loss errors and a number of charge gain errors of the memory unit. In some implementations, the voltage threshold analyzer is configured to calculate a $V_T$ offset error differential, the $V_T$ offset error differential comprising a difference between a number of errors of the predominant type at a first $V_T$ offset and a number of errors of the predominant type at a second $V_T$ offset and to determine a $V_T$ offset using a ratio of the error type differential and the $V_T$ offset error differential.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings wherein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
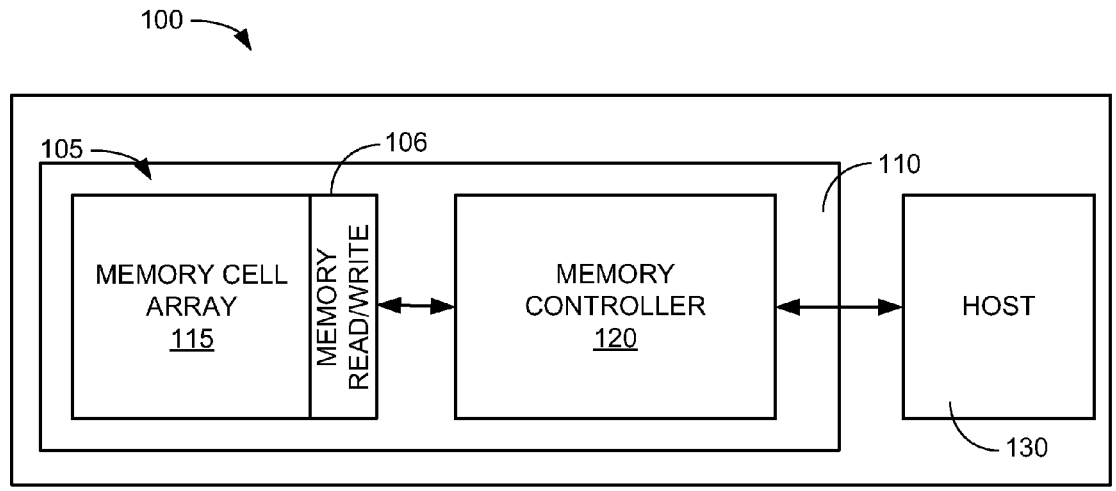
FIGS. 1A-1C are block diagrams of a system capable of adjusting one or more threshold voltage ($V_T$) values according to embodiments described herein.

Non-volatile memory devices are capable of retaining stored data for relatively long periods of time, even in the absence of external power. Non-volatile, solid-state memory includes floating gate memory, e.g., flash memory, which programs data into memory cells by applying a voltage to the memory cell, the applied voltage causing a charge to be stored on a floating gate of a transistor. The data can be read later from the memory cell by sensing the voltage of the transistor and comparing the sensed voltage to one or more read threshold voltages, $V_T$s.

Memory cells are known to exhibit errors caused, for example, by charge leakage, manufacturing defects, and disturb effects. These errors may be manifested as bit errors in the decoded data. A memory device may use a number of measures to account for these errors, such as error correction codes (ECC) that utilize extra data for detecting and correcting bit errors. The memory device may generate a bit error rate (BER) signal based on ECC activity and can use BER to analyze system performance.

Memory devices may comprise single-level memory cells or multi-level memory cells. Single level cell (SLC) memory uses memory cells that store one bit of data per cell. Data is read from the SLC by sensing the voltage of the memory cell and comparing the sensed voltage to a threshold voltage. If the sensed voltage is greater than the threshold voltage, it is determined that the bit is in a first state, e.g., the "0" state, and if the sensed voltage is less than the threshold voltage, it is determined that the bit is in a second state, e.g., the "1" state. In multi-level cell (MLC) memory, the memory cells can be programmed to store two or more bits of information. For example, a two bit MLC is capable of storing four two bit symbols, 00, 01, 10, 11, each symbol corresponding to a different voltage level stored in the memory cell.

In general, a memory cell may be programmed to a number of voltages, M, where M can represent any of $2^m$ memory states. The value m is equal to the number of bits stored, and is greater than 1 for MLC memory. For example, memory cells programmable to four voltages can store two bits per cell (M=4, m=2); memory cells programmable to eight voltages have a storage capacity of three bits per cell (M=8, m=3), etc.

The memory cells of a memory device can be grouped into data units referred to herein as data pages or blocks. A data page can correspond, for example, to a group of memory cells that are read together during a read operation. A group of memory pages that are erased at substantially the same time may be referred to as a block or erasure unit. Memory cells are programmed in units of pages and the pages are not re-programmed, once programmed, until after the block of pages is erased. Garbage collection operations can be performed on the blocks of pages, wherein the blocks are erased after active data stored in each block is moved to another location. Thus, as a result of garbage collection, each memory cell of the memory device undergoes numerous program/erase (PE) cycles during the lifetime of the memory cell. In floating gate transistor memory cells, each PE cycle can degrade the cell, and after many PE cycles, lead to a decreased ability of the cell to retain data without substantial charge leakage.

Charge loss or charge gain in the memory cells may lead to data errors such that data read from the memory cells does not correspond to the originally stored data. The errors in reading the data may be decreased by modifying the read threshold voltage ($V_T$) used to read data stored in the memory cells. Charge loss through such means as, for example, charge leakage causes the voltage stored in the floating gate of the memory cell to shift to the negative voltage shift (−ve) direction while disturb effects may cause the voltage stored on the floating gate of the memory cell to shift to the positive voltage shift (+ve) direction. Thus, a search scheme may be developed to attain optimal $V_T$ values to read the shifted memory cell voltages during use of the memory device.

Determining optimal $V_T$ values (or $V_T$ offsets from a currently used $V_T$ value) used to read the memory cells can help reduce BER. Efficient determination of the optimal $\Delta V_T$s can reduce processing time. Embodiments disclosed herein involve identifying whether the voltage shift errors of a memory unit of solid state memory cells are in the +ve (gain) direction or the −ve (loss) direction. A predominant type of error (charge gain or charge loss) is determined. An optimal $\Delta V_T$ is determined using a difference between the number of loss errors and the number of gain errors in conjunction with measured errors of the predominant type at several $V_T$s.

FIG. 1A is a block diagram of a system 100 capable of storing data in memory cells and later retrieving the data. Reading the data includes adjusting one or more $V_T$ values used for reading data to achieve bit error rates (BERs) less than a predetermined value. The system 100 includes a memory element 110 that may be coupled for communication with a host processor 130. The memory element 110 comprises a memory 105 and a memory controller 120 that is in communication with the host 130. The memory includes a memory cell array 115 and a memory read/write element 106. The memory controller 120 shown in FIG. 1A is configured to determine optimal $\Delta V_T$s according to various embodiments discussed herein. For example, the memory controller 120 may be configured to implement the flow diagrams of FIGS. 5A, 5B, and 6 as discussed in more detail below.

The block diagram of FIG. 1A and other block diagrams discussed herein show system components divided into functional blocks. It will be appreciated by those skilled in the art that there exist many possible configurations in which these functional blocks can be arranged and implemented. The examples depicted herein provide some possible functional arrangements for system components. For example, alternative embodiments may provide all or a portion of the functionality of the memory controller 120 within the host 130. Other implementations may encompass the read/write element 106 included with the functions of the controller 120. The various approaches described herein may be implemented using hardware, software, or a combination of hardware and software. Memory chips, controller chips and/or chips of the host computer may contain one or more of the functional elements discussed herein, for example.

Figure 1B:
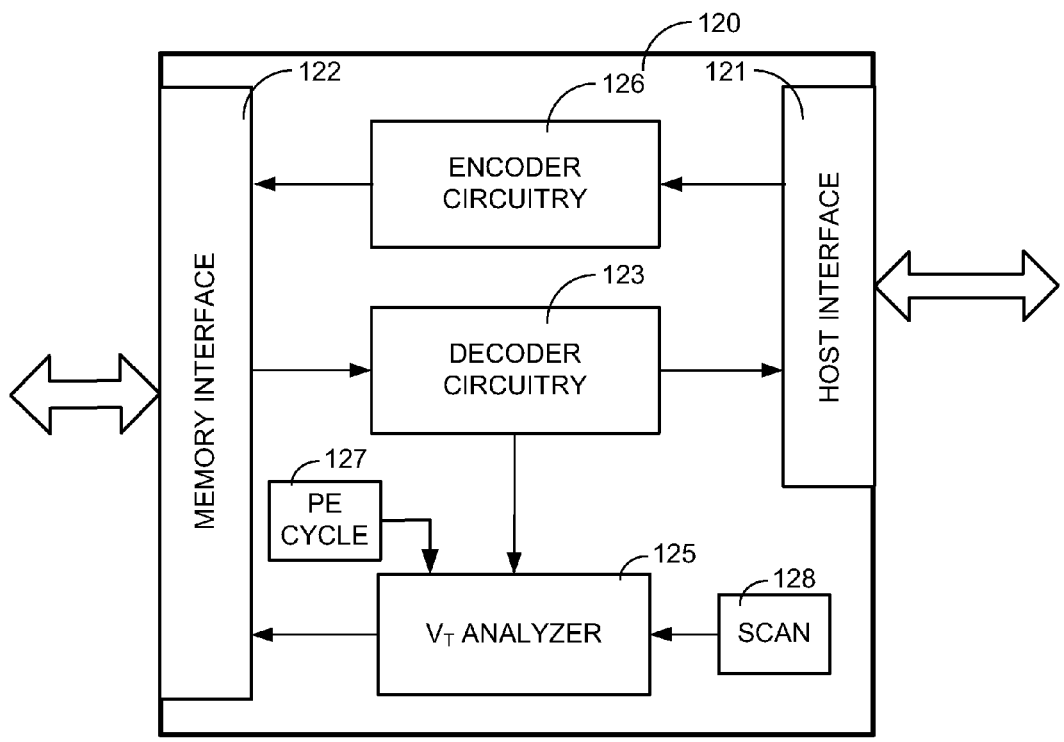

FIG. 1B provides a more detailed view of the memory controller 120 of FIG. 1A including a threshold voltage ($V_T$) analyzer in accordance with some embodiments discussed herein. The memory controller 120 shown in FIG. 1B comprises a host interface 121, a memory interface 122, encoder circuitry 126, decoder circuitry 123, a $V_T$ analyzer 125, a PE cycle counter 127, and scan circuitry 128. The memory interface 122 serves to permit the memory controller 120 to communicate with the memory device 110. The host interface 121 serves to permit communication between the memory controller 120 and the host 130. The host interface 121 passes data that is to be stored in the memory device 110 to the encoder circuitry 126. The encoder circuitry 126 encodes the data using an error correcting code (ECC) and provides the encoded data to the memory interface 122.

To implement write operations, the memory read/write element 106 receives the encoded data from the memory interface 122 and generates signals that cause the encoded data to be stored in memory cells of the memory array 115. To implement read operations, the memory read/write circuitry 106 senses the voltages of the memory cells in the memory array 115, and compares the sensed voltages to one or more threshold voltages, $V_T$s. By comparing the sensed voltage of the cell to the $V_T$s, the voltage level of the memory cell can be ascertained. The voltage level represents the data stored in the memory cells of the memory cell array 115. The memory interface 122 passes data that is read from the memory cell array 115 to the decoder circuitry 123. The data read from the memory cells is decoded by the decoder and the decoded data can be transmitted through the host interface 121 to the host 130.

In some embodiments, the decoder circuitry 123 and the $V_T$ analyzer 125 operate in cooperation with other system components to determine an optimal $V_T$. Once an optimal $V_T$ (or set of $V_T$s in the case of MLC devices) is determined, that $V_T$ or set of $V_T$s may be used to read additional data, e.g., a subsequent read of the same memory unit or to read other memory units, e.g., a memory unit may be a page of memory. According to various implementations described herein, the $V_T$ analyzer 125 is configured to identify a predominant type of error of a memory unit. In some embodiments, the $V_T$ analyzer 125 is configured to identify whether the voltage shift errors of the memory unit are in the +ve (gain) direction or the −ve (loss) direction. The $V_T$ analyzer 125 determines the predominant type of error (charge gain error or charge loss error). An optimal $V_T$ is determined using a difference between the loss errors and gain errors in conjunction with measured errors of the predominant type at several $V_T$s. The PE cycle counter 127 determines a number of program/erase cycles of the memory unit. In some cases, the system includes scan circuitry 128 that is configured to control periodic scanning of memory cells.

Figure 1C:
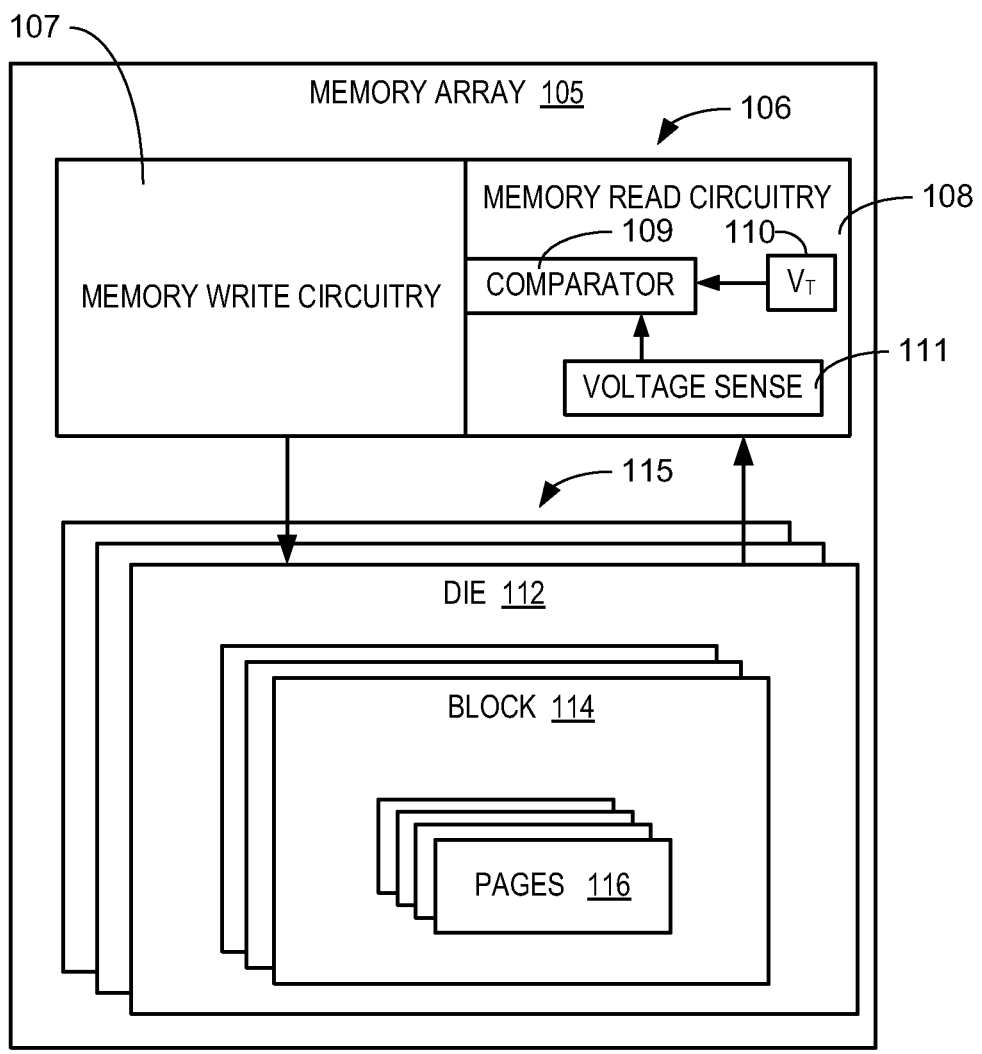

FIG. 1C provides a more detailed view of the memory 105 of FIG. 1A. In the illustrated embodiment, the memory 105 includes memory cell array 115 having memory cells arranged in pages 116, blocks 114, and die 112. As previously discussed, the memory includes memory read/write circuitry 106 arranged to read data from and write data to the memory cell array 115. The memory read/write circuitry includes memory write circuitry 107 and memory read circuitry 108. The memory read circuitry 108 is capable using $V_T$s determined by the $V_T$ analyzer 125 to read the voltage on the memory cells and thus obtain data stored in the memory cells.

Figure 2A:
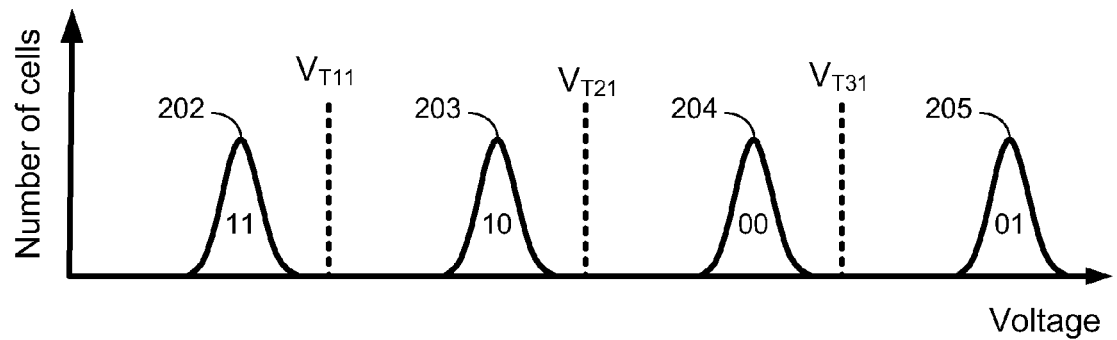
FIGS. 2A and 2B show examples of the voltage distribution of data stored a two-bit per cell multi-level memory cell (MLC) device.
Figure 2B:
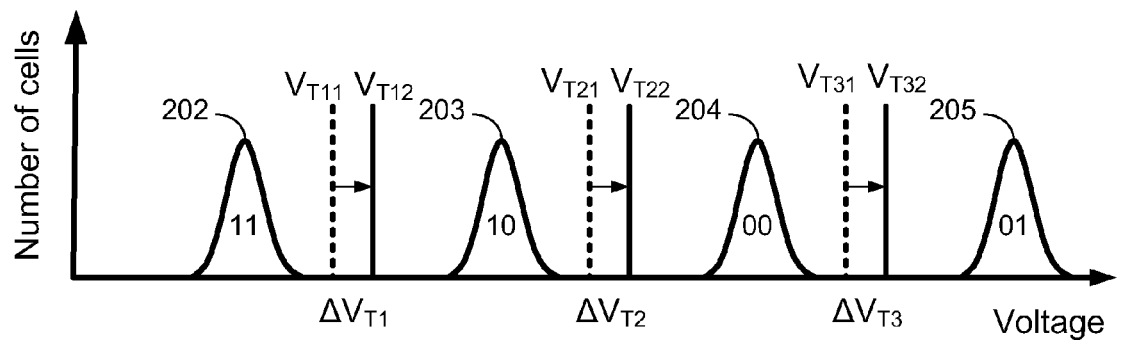

For example, consider the voltage distributions 202, 203, 204, 205 of a two-bit per cell MLC memory as shown in FIGS. 2A and 2B. A two-bit per cell memory has four possible states, corresponding to four data symbols 11, 10, 00, 01. Each symbol corresponds to a particular voltage level. When memory cells are programmed, the cells are charged to a target voltage level corresponding to the two bits of data being stored. The number of memory cells across a memory unit (e.g., a block or a page of memory) corresponding to each state 11, 10, 00, 01 can be assumed fall into a Gaussian distribution based on the voltages of the cells, as shown in FIG. 2A. Assuming the Gaussian distribution, when the voltages are read from the memory cells, the sensed voltages of cells of a page (or other unit) of the MLC memory device may be distributed around the target voltage levels and fall within voltage distributions 202-205, respectively. Voltage distribution 202 includes the voltages of the memory cells corresponding to symbol 11, distribution 203 includes the voltages of the memory cells corresponding to symbol 10, voltage distribution 204 includes the voltages of the memory cells corresponding to symbol 00, and voltage distribution 205 includes the voltages of the memory cells corresponding to symbol 01.

As shown in FIG. 2A, $V_{T11}$, $V_{T21}$, $V_{T31}$ are a set of read threshold voltages that are used to read the memory cells to determine which symbols are stored in the cells. For example, after the voltage corresponding to the symbol 10 is applied to a cell during a program operation, the symbol 10 is said to be programmed into the cell. At a later time, the voltage of the cell is sensed and the sensed voltage is compared to one or more read threshold voltages $V_{T11}$, $V_{T21}$, $V_{T31}$ to read the voltage level, and thus determine the symbol stored in the cell. During a read operation, the sensed voltage may first be compared to $V_{T21}$. If the comparison to $V_{T21}$ determines that the sensed voltage is less than $V_{T21}$, then the symbol stored in the cell is either 11 or 10. If the voltage is less than $V_{T21}$, the sensed voltage may next be compared to $V_{T11}$. If the sensed voltage is greater $V_{T11}$, then the symbol stored in the cell is determined to be 10 and if the sensed voltage is less than $V_{T11}$ then the symbol stored in the cell is determined to be 11. If the sensed voltage for this cell deviates from the voltage value programmed into the cell, then an error occurs when the cell is read. For example, if the cell was programmed to be to a voltage between than $V_{T11}$ and $V_{T21}$ (corresponding to symbol 10) but the voltage read from the cell during a subsequent read corresponds to data symbol 11, then an error occurs.

Errors can arise from several sources. Charge stored in a memory cell may need to be retained for months or years, e.g., longer than 10 years, even in the absence of power. Even a low charge leakage rate from the memory cell can cause data errors to occur if the retention time, τ, is substantial. Disturb effects may occur when the charge stored on the floating gate of a transistor memory cell is disturbed unintentionally by local electrical signals present when other memory cells are erased, written to (programmed), and/or read.

Generally, a variety of error correction code (ECC) algorithms are known that can identify and/or correct a known number of bit errors for a predefined word size and number of ECC bits. Memory systems may use multiple levels of error coding (e.g., inner and outer coding) to improve overall error correction performance. The BER is used to gauge the performance of the memory in general. Soft information can be used by some types of decoders, e.g., LDPC decoders, and provides a measure on the reliability of a bit being a "0" or a "1". The soft information can be used to develop a log likelihood ratio (LLR) which represents the bit read from the memory cell along with reliability information. The soft information can be developed in various ways, e.g., based on a noise distribution of the channel or by multiple reads of the memory cells.

Although ECC can be used to detect and correct some errors, the use of optimal $V_T$s used to read memory cells can reduce the number of errors that need to be detected and/or corrected. To determine an optimal set of $V_T$ values for MLC devices, the $V_T$s may be adjusted to levels different from previously used $V_T$s. For example, referring to FIG. 2B, a set of offsets, $\Delta V_{T1}$, $\Delta V_{T2}$, $\Delta V_{T3}$ may be applied to the set of $V_T$s, $V_{T11}$, $V_{T21}$, $V_{T31}$. The resulting set of $V_T$s after offsets $\Delta V_{T1}$, $\Delta V_{T2}$, $\Delta V_{T3}$ are applied is $V_{T12}$, $V_{T22}$, $V_{T32}$.

It should be noted that in an arrangement such as shown in FIGS. 2A and 2B, the two bits in each cell need not be associated with the same word or page. For example, a memory system may be arranged so that the leftmost bit (most significant bit, or MSB) is associated with one word/page, and the rightmost bit (least significant bit, or LSB) is associated with another word/page. This arrangement may be referred to herein as "multipage."

Generally, a bit error occurs when the threshold voltage representing the data deviates from its expected range of values. Thus, in reference to FIG. 3A, if the threshold voltage originally programmed to be in the range 302 was later readback as being in the adjacent range 303, then a one-bit error ("10" instead of "11") would occur. A one-bit error would also occur if the threshold voltage was instead in the range 305 ("01" instead of "11"). However, the latter case may represent a more serious physical problem with the underlying cell than the former, because the deviation in the latter case is significantly larger than the former. The existence and extent of these types of deviations may not be apparent when looking at BER alone.

Figure 3A:
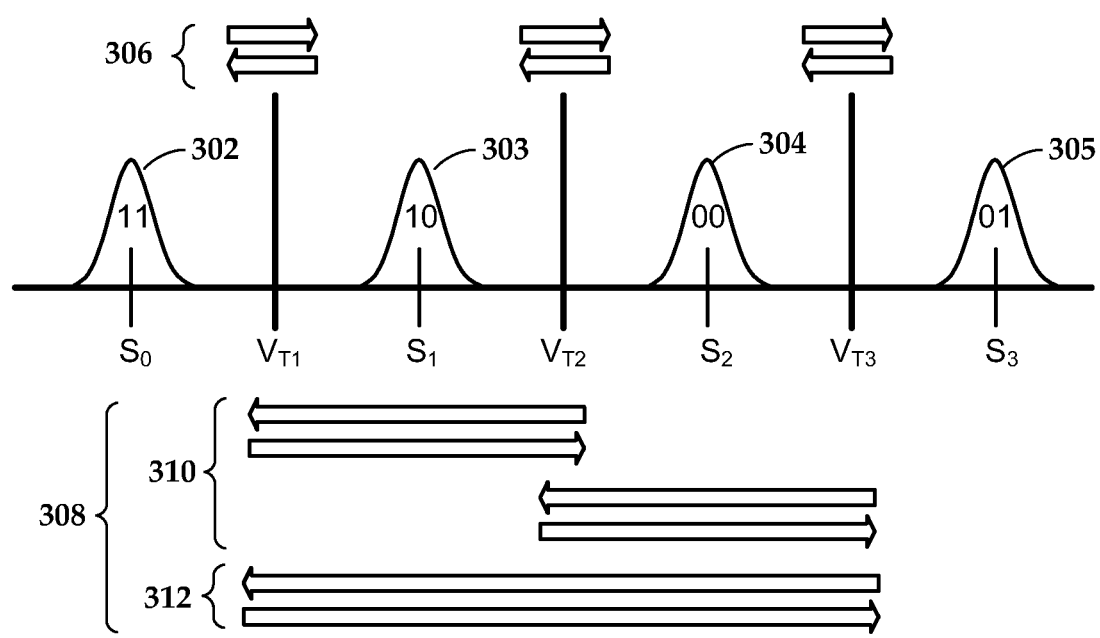
FIG. 3A illustrates different types of errors that may occur in multi-level memory cells.

In FIG. 3A, arrows generally indicated by reference numeral 306 and 308, represent different categories of errors that may be manifested by a memory device according to example embodiments. These arrows 306, 308 may be referred to herein alternately as voltage shifts and/or errors. The arrows 306, 308 represent a change in floating gate voltages from an expected level to an actual, measured level. For purposes of this discussion, the term "expected levels" at least refers to a range of voltages that should be exhibited by the cell during a read operation, typically without applying any ECC to correct bit errors. The expected levels may differ somewhat from nominal and/or ideal levels, based on such factors as cell age, elapsed time since the data was written, environmental conditions, etc. The operation during which the "actual" voltage value is determined may occur during any type of data access operation, including reads, writes, erasures, etc. If the actual measurement is different than the expected to the extent that a bit error would occur, the arrows 306, 308 indicate a direction and magnitude of that difference.

For the four-level MLC shown in FIG. 3A, there are twelve total errors in two groupings 306, 308. The number of these types of errors may be generally represented as M*(M−1), where M is the number of different voltage levels used to store data in each cell. The first group of errors 306 represent a shift that causes the actual voltages to be located in a voltage range 302-305 that is adjacent to the expected range. There are six (2M−2) of these types of errors 306 for two-bit per cell MLC memory. For example, reading a "11" when a "01" was programmed indicates the actual voltage shifted to the left across the $V_{T1}$ boundary.

The second group of errors 308 represents shifts that cause the actual measurements to be located in voltage ranges 302-305 that are not adjacent to the expected voltage ranges 302-305. There are six ($M^2-3M+2$) of these types of errors 308 for two-bit per cell MLC memory. This group 308 is broken into two subgroups, 310 and 312. Subgroup 310 represents shifts of more than one voltage range, and subgroup 312 represents shifts of more than two voltage ranges.

For purposes of discussion, the first group of errors 306 may be referred to as "common" or "simple" errors. This terminology (as well as the terminology "first" and "second") is not intended to require that the underlying causes of the errors are limited to any particular complexity or difficulty to diagnose or correct. The term "simple error" may generally indicate that error 306 is at least more common than errors 308 in a typical memory device. In many instances, simple errors 306 may be caused by phenomena such as loss of charge over time and/or in response to high temperature. Other phenomena that can often lead to simple errors is known as "disturb," which is changes in stored charge of a floating gate caused by activity (e.g., reading, programming) occurring in physically adjacent cells.

In contrast to simple errors 306, complex errors 308 may be less likely to occur in a nominally functioning memory device. While complex errors 308 may be caused by the same phenomena (e.g., passage of time, disturb) that causes simple errors 306, the magnitude of the threshold shift is larger than would normally be expected, even if the device is subjected to extremes within its specified operating conditions. This could be the result of other factors, such as manufacturing defects, localized perturbations (e.g., electrical shock, thermal hotspots), design defects, accelerated wear, etc. For example, some cells may exhibit a failure mode where the state of the cell is not affected by the level to which it is programmed. Generally, it may be desirable for a device to treat errors of the complex type 308 differently than those of the simple type 306.

Figures 3B, 3C:
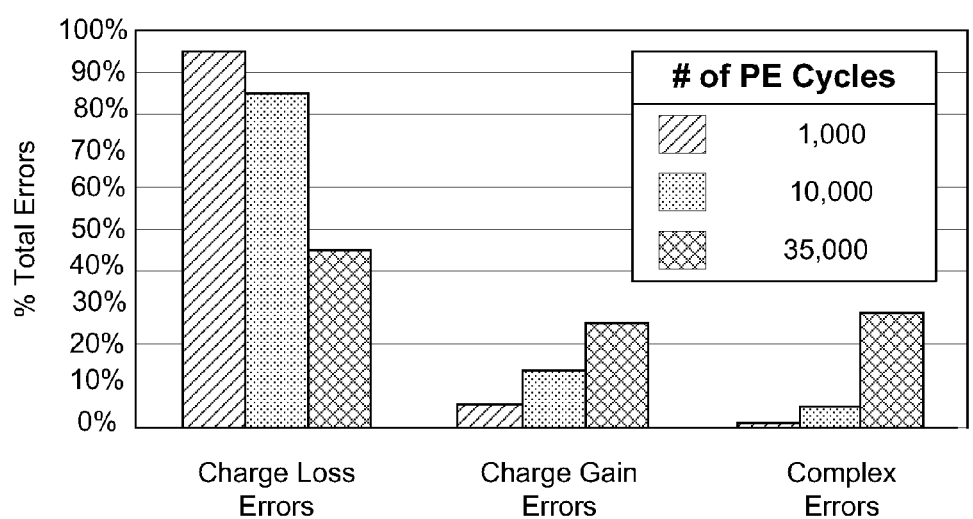
FIG. 3B shows a table that categorizes types of errors.
FIG. 3C is a histogram that illustrates that different types of errors depend on the number of Program/Erase (PE) cycles experienced by the memory device.

FIG. 3B shows a table that categorizes types of errors measured in a memory device after 1000 PE cycles. The percentage of different types of errors determined for the four programmed states is shown. The diagonal table entries 321 are filled with 0s because no error is reported for reading back the same written pattern. Table entries that contain the percentage of charge gain errors 322 indicate that simple charge loss errors account for most of the errors at the 1000 PE cycles. Table entries that represent the percentage of simple charge loss errors 323 are also shown. The errors recorded in the remaining table entries represent the percentages of complex errors 324. These more complex errors could have resulted from program misoptimization. For example, the complex errors may have resulted from changing key parameters during programming, or other phenomena as previously discussed. Embodiments disclosed herein involve determining optimal $V_T$s that compensate for simple charge loss and the charge gain errors.

FIG. 3C is a histogram that illustrates that different types of errors depend on the number of PE cycles experienced by the memory device. The example shown in FIG. 3C shows a three month retention error characterization while the data in FIG. 3B was produced without any additional retention loss testing. In this histogram, charge loss errors account for about 95% of the errors when there are 1000 PE cycles. This percentage drops as the number of PE cycles increases. FIG. 3C illustrates that the number of charge loss errors at 35,000 PE cycles is about 45%. FIG. 3A also shows that charge gain errors and complex errors increase with an increasing number of PE cycles.

Figure 4A:
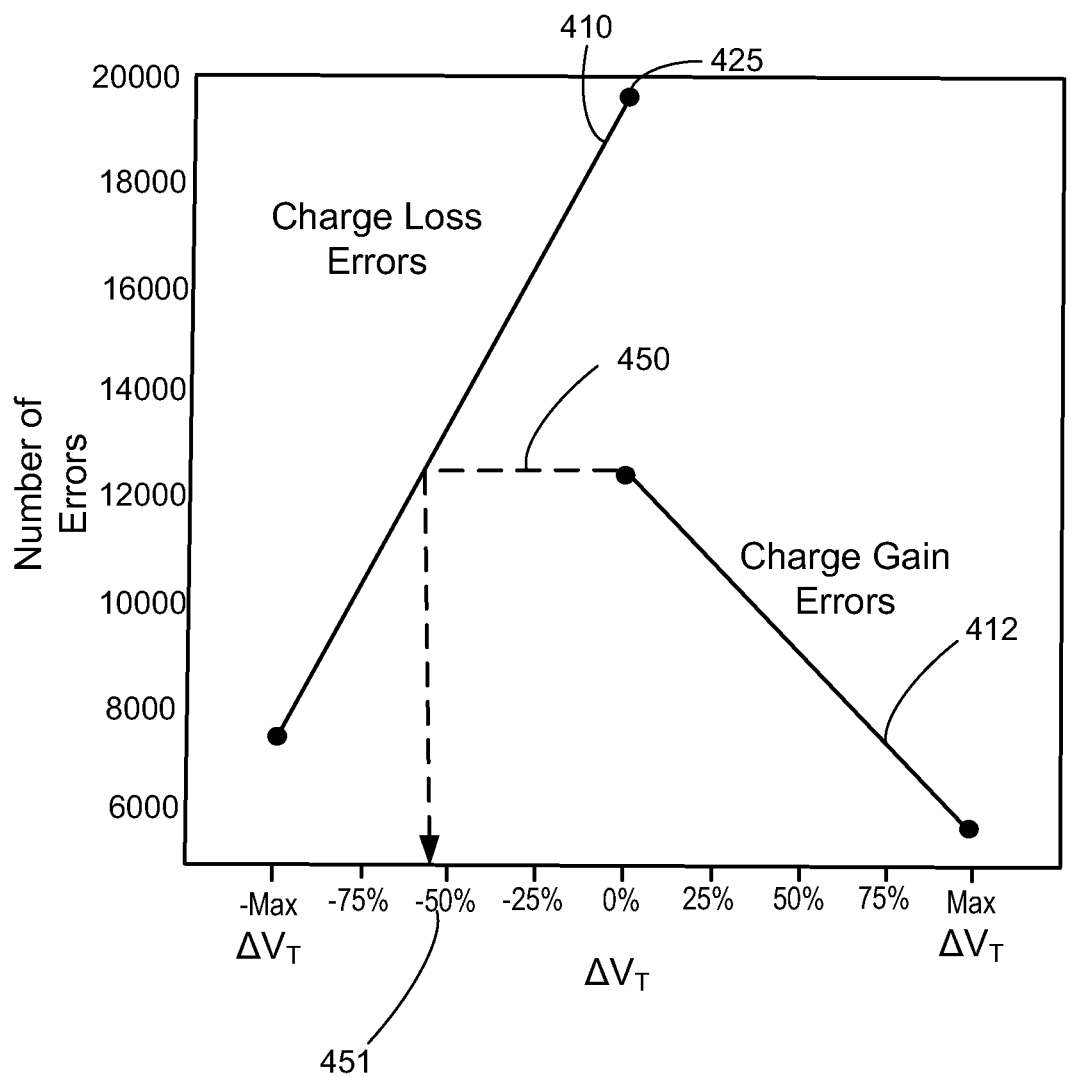
FIGS. 4A and 4B are graphs illustrating a process for determining a VT offset.
Figure 4B:
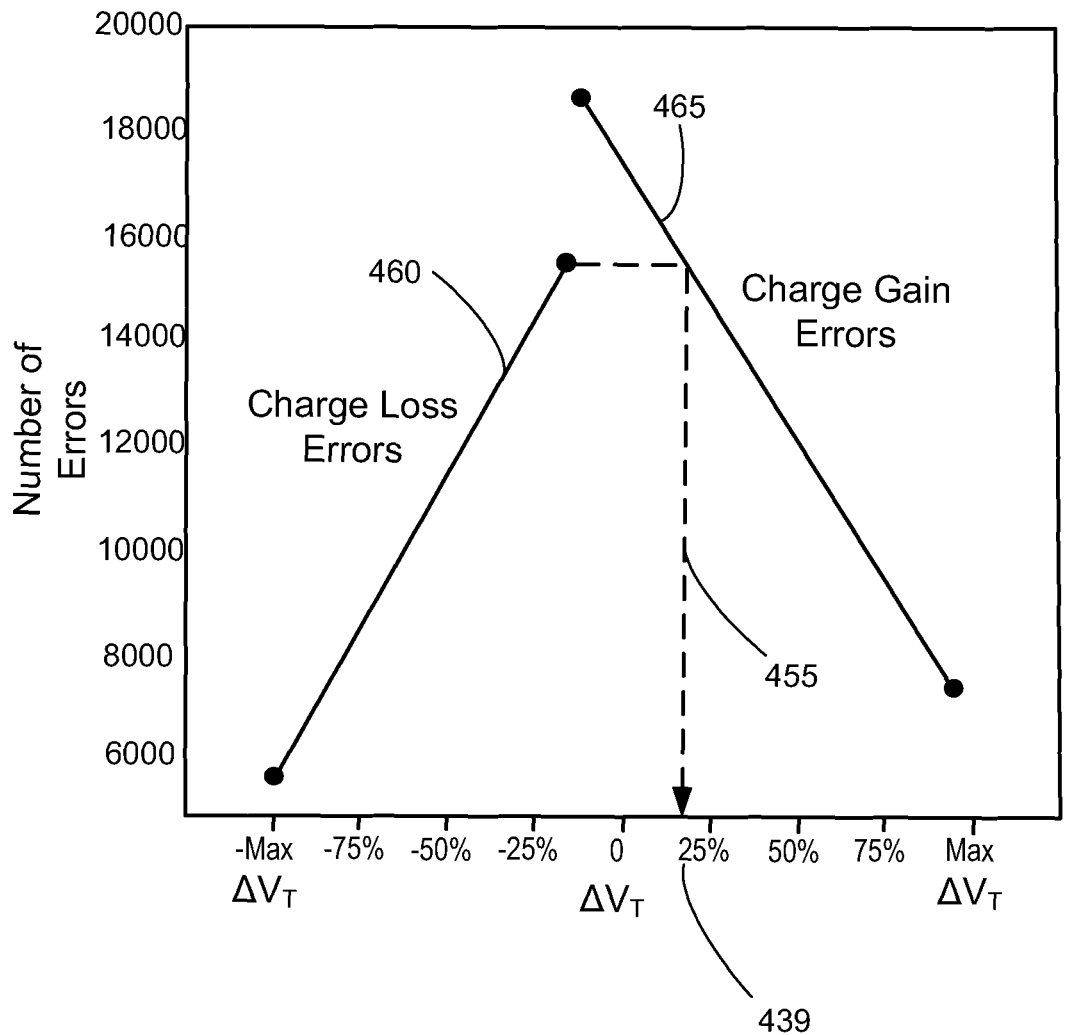

According to various implementations, the number of charge loss errors and the number of charge gain errors identified after a read operation of a memory unit, e.g., a page, are used to determine an optimal $V_T$ that can be used for subsequent read operations. Graphs represented in FIGS. 4A and 4B illustrate a process for determining optimal $\Delta V_T$s. Line 410 in FIG. 4A represents the estimated charge loss errors at different $V_T$s. In some implementations, the line 410 is developed by measuring two values of charge loss error at two different $V_T$s. For example, the number of charge loss errors may be measured at a current $V_T$ (an offset of 0 from the current $V_T$ is represented by 0 on the horizontal axis of FIG. 4A) and the number of second charge loss errors may be measured at a maximum offset from the current $V_T$ (-Max $\Delta V_T$ on the horizontal axis of FIG. 4A). A similar process is applied to estimate the number of charge gain errors. The second line 412 represents the estimated number of charge gain errors at different $V_T$ offsets. The line 412 can be developed by measuring the number of charge gain errors at a current VT (0% on the horizontal axis of FIG. 4A) and the number of charge gain errors at a maximum offset from the current $V_T$ (Max $\Delta V_T$ on the horizontal axis of FIG. 4A). In some implementations, the maximum offset is 160 mV. The number of charge gain errors at no $V_T$ offset ($\Delta V_T$=0) and the estimated charge loss errors of line 410 are used to determine the optimal $\Delta V_T$ 451. The dotted line 450 of FIG. 4A indicates that the optimal $\Delta V_T$ is shifted in the direction of the predominant error type, which in this example is charge loss. This process produces the following equation for determining the optimal $\Delta V_T$.

$$\text{Optimal } \Delta V_T = \frac{(CL \text{ errors}(\Delta V_T = 0) - CG \text{ erors}(\Delta V_T = 0))}{(CL \text{ errors}(\Delta V_T = 0) - CL \text{ errors}(\Delta V_T = \Delta V_{TMax}))} \times \Delta V_{TMax}, \quad [1]$$

where CL errors are charge loss errors, CG errors are charge gain errors.

According to some implementations, as reflected in FIG. 4A, the number of charge loss errors at $\Delta V_T$=0 is greater than the number of charge gain errors at $\Delta V_T$=0. In other implementations, as reflected in FIG. 4B, the number of charge gain errors at $\Delta V_T$=0 is greater than the number of charge loss errors at $\Delta V_T$=0. Line 460 in FIG. 4B represents the estimated charge loss errors at different $V_T$s. In some implementations, the first number of charge loss errors may be measured at a current $V_T$ (an offset of 0 from the current $V_T$ as represented by 0 on the horizontal axis of FIG. 4B) and a second number charge loss errors may be measured at a maximum offset from the current $V_T$ (-Max $\Delta V_T$ on the horizontal axis of FIG. 4B). Line 460 in FIG. 4B represents the estimated charge loss errors at different $V_T$s. In some implementations, the line 460 is developed by measuring two values of charge loss error at two different $\Delta V_T$s. For example, the number of charge loss errors may be measured at a current $V_T$ (an offset of 0 from the current $V_T$ is represented by 0 on the horizontal axis of FIG. 4B) and the number of second charge loss errors may be measured at a maximum offset from the current $V_T$ (-Max $\Delta V_T$ on the horizontal axis of FIG. 4B). A similar process is applied to estimate the number of charge gain errors. The line 465 represents the estimated number of charge gain errors at different $\Delta V_T$s. The line 465 can be developed by measuring the number of charge gain errors at a current $V_T$ (0 offset on the horizontal axis of FIG. 4B) and the number of charge gain errors at a maximum offset from the current $V_T$ (Max $\Delta V_T$ offset on the horizontal axis of FIG. 4B). The number of charge loss errors at no $V_T$ offset ($\Delta V_T$=0) and the estimated charge gain errors of line 465 are used to determine the optimal $\Delta V_T$ 439. The dotted line 455 of FIG. 4B indicates that the optimal $\Delta V_T$ is shifted in the direction of the predominant error type, which in this example is charge gain. This process produces the following equation for determining the optimal $\Delta V_T$.

$$\text{Optimal } \Delta V_T = \frac{(CG \text{ errors}(\Delta V_T = 0) - CL \text{ errors}(\Delta V_T = 0))}{(CG \text{ errors}(\Delta V_T = 0) - CG \text{ errors}(\Delta V_T = \Delta V_{TMax}))} \times \Delta V_{TMax}, \quad [2]$$

where CL errors are charge loss errors, CG errors are charge gain errors.

Figure 5:
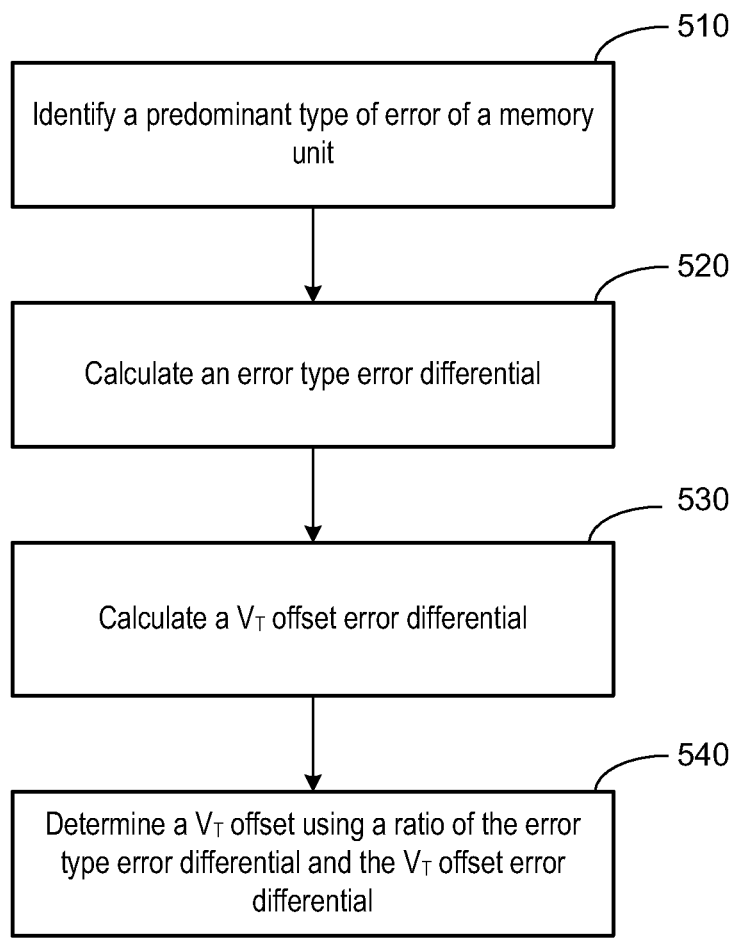
FIGS. 5 and 6 provide flow diagrams of methods in accordance with some embodiments.
Figure 6:
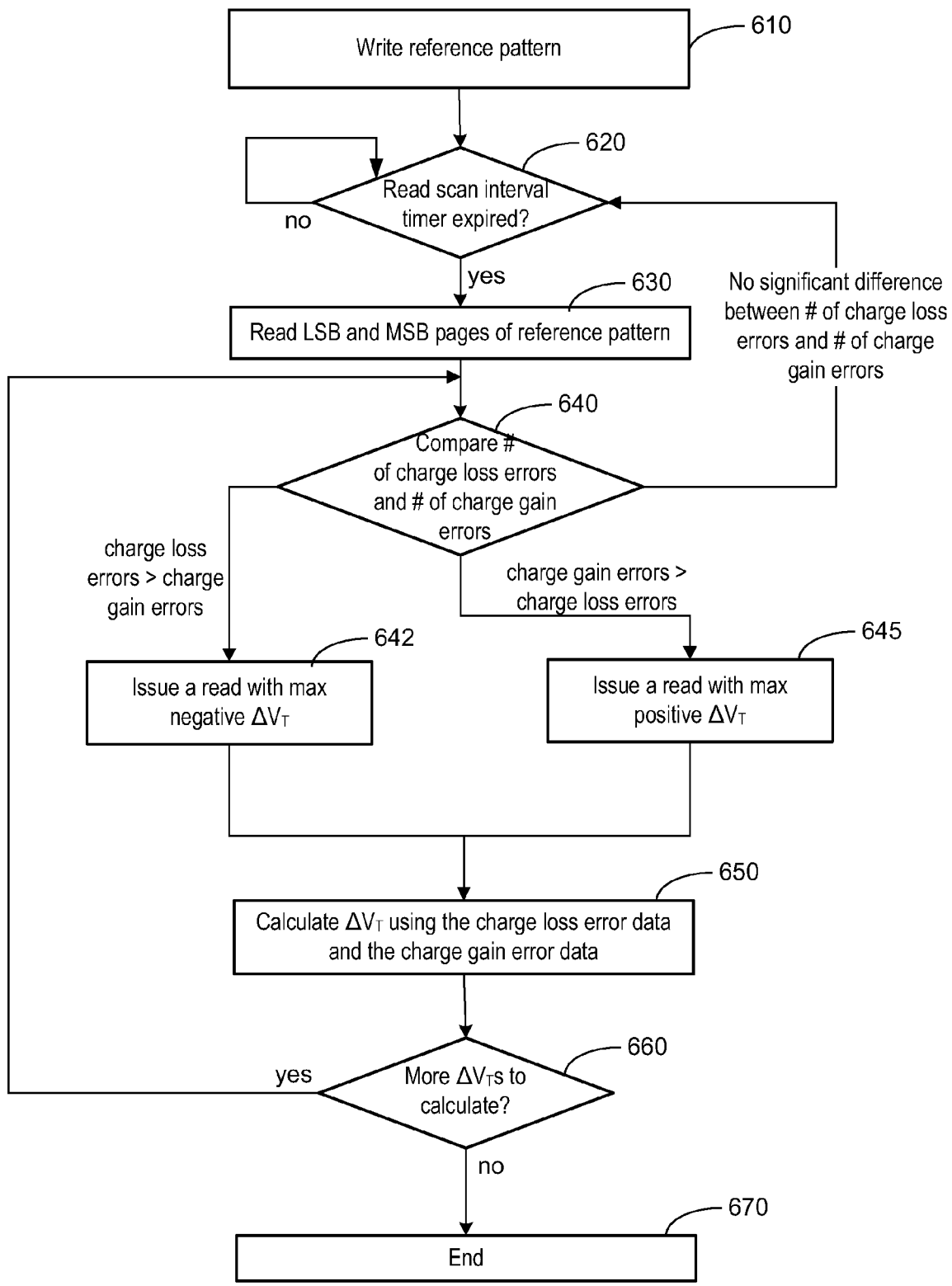

FIGS. 5 and 6 provide flow diagrams that illustrate the process applied to FIGS. 4A and 4B in accordance with some embodiments. A predominant type of error of a memory unit of solid state memory cells is identified 510. In some implementations, determining the predominant type of error may include using a reference pattern that is stored and read back from the memory unit, for example. According to various embodiments, the predominant type of error is identified by reading the reference pattern stored in the memory cells and counting the number of charge gain errors, counting the number of charge loss errors, and determining whether there are more charge gain errors or more charge loss errors.

An error type differential between the number of charge loss errors and the number of charge gain errors is calculated 520. The term "error type differential" is used herein to refer to the difference between a number of charge loss errors and a number of charge gain errors of the memory unit, where the difference may be either the number of charge loss errors minus the number of charge gain errors (if the charge gain errors are predominant) or the number of charge gain errors minus the number of charge loss errors (if the charge loss errors are predominant). As described previously, the charge gain errors and the charge loss errors are caused by voltage shifts between two adjacent voltage levels of a memory cell.

A $V_T$ offset error differential is calculated 530. The $V_T$ offset error differential is a difference between the number of errors of the predominant type at a first $V_T$ offset and the number of errors of the predominant type at a second $V_T$ offset. According to various implementations, the first $V_T$ offset used for calculating the $V_T$ offset error differential is at zero offset from a current $V_T$ value. According to various implementations, a second $V_T$ offset used for calculating the $V_T$ offset error differential is at a maximum $V_T$ offset from a current $V_T$ value. $V_T$ offset values other than zero $V_T$ offset and maximum $V_T$ offset may be used for calculating the $V_T$ offset error differential. An optimal $V_T$ offset is determined 540 using a ratio of the error type differential and the $V_T$ offset error differential. According to various embodiments, the optimal $V_T$ offset can be determined for each of the set of threshold voltages (set of $V_T$s) used to read a multi-level memory cell.

In some embodiments, the number of program erase (PE) cycles may be used to in a re-optimization of the $V_T$s. In one example, the number of PE cycles is determined and the optimal $V_T$ offset is determined using the ratio of the error type differential and the $V_T$ offset error differential if the number of PE cycles of the memory unit is less than a predetermined value. In some cases, the optimal $V_T$ offset is determined using a second process, different from the first process, in response to the number of PE cycles being above the predetermined threshold. For example, the first $V_T$ optimization process may be more appropriate when simple errors (errors that shift only one voltage level) are predominant or represent a predetermined percentage of the errors. The second $V_T$ optimization process used may be more appropriate when more complex errors (errors that shift more than one voltage level) are present in significant number, The process described above in connection with FIGS. 4A, 4B and 5 is particularly useful for determining optimal $\Delta V_T$s when the predominant errors are simple errors. In some cases, it may be useful to use one process for determining optimal $\Delta V_T$s when the errors are simple errors and to use another process for determining optimal $\Delta V_T$s when the errors are complex. According to various embodiments, the process determines whether the number of complex errors is greater than at least one of the number of charge loss errors and the number of charge gain errors. In some cases, the optimal $\Delta V_T$s are determined using the ratio of the error type differential and the $V_T$ offset error differential as set forth above in response to the number charge gain errors or the number of charge loss errors being greater than the number of complex errors. In some cases, the optimal $\Delta V_T$s are determined using a different process than using the ratio of the error type differential and the VT offset error differential in response to the number of complex errors being greater than at least one of the number of charge loss errors and the number of charge gain errors.

FIG. 6 provides a more detailed flow diagram that illustrates a process in accordance with some embodiments. A reference pattern is written 610 to the memory cells. The reference pattern can be written for the least significant bit (LSB) page and its corresponding most significant bit (MSB) pages. The memory cells may be read periodically, where the period is controlled by a read scan interval timer. A determination 620 is made regarding whether the read scan interval timer has expired. If the timer has not expired, the process continues to wait until the timer has expired. If it is determined 620 that the read scan interval timer has expired, the LSB and the MSB pages of the reference pattern are read 630. The number of charge loss errors and the number of charge gain errors are compared 640. If there is no significant difference between the number of charge loss errors and the number of charge gain errors, the process returns to determine 620 wait for the next interval. If the number of charge loss errors is greater than the number of charge gain errors, a read command is issued 642 using a maximum negative $\Delta V_T$. If the number of charge gain errors is greater than the number of charge loss errors, a read command is issued 645 with a maximum positive $\Delta V_T$. An optimal $\Delta V_T$ is calculated 650 using the charge loss error data and the charge gain error data, e.g., as previously set forth in Equation 1. The process determines 660 whether there are more $\Delta V_T$s to determine optimal values. For multilevel cells, there are a set of $\Delta V_T$s that may be optimized. For example, in a two bit cell there are at least three $\Delta V_T$s for which optimal values may be determined. If it is determined 660 that there are more $\Delta V_T$s to calculate, the process continues with comparing 640 the number of change loss errors with the number of charge gain errors for the next $V_T$. If it is determined 660 that there are no more $\Delta V_T$s to calculate, the process ends 670.

Although the subject matter has been described in language specific to structural features and/or methodological acts, it is to be understood that the subject matter defined in the appended claims is not necessarily limited to the specific features or acts described above. Rather, the specific features and acts described above are disclosed as representative forms of implementing the claims.

What is claimed is:

1. A method, comprising:
    identifying a predominant type of error of a memory unit of solid state memory cells;
    calculating an error type differential, the error type differential comprising a difference between a number of charge loss errors and a number of charge gain errors of the memory unit;
    calculating a $V_T$ offset error differential, the $V_T$ offset error differential comprising a difference between a number of errors of the predominant type at a first $V_T$ offset and a number of errors of the predominant type at a second $V_T$ offset; and
    determining a $V_T$ offset using a ratio of the error type differential and the $V_T$ offset error differential.

2. The method of claim 1, wherein the first $V_T$ offset comprises zero offset from a current $V_T$ value.

3. The method of claim 1, wherein the second $V_T$ offset comprises a maximum $V_T$ offset.

4. The method of claim 1, wherein determining the predominant type comprises:

reading data stored in the memory cells;
counting the number of charge loss errors in the data that are due to memory cell charge loss;
counting the number of charge gain errors in the data that are due to memory cell charge gain; and
comparing the number of charge loss errors to the number of charge gain errors.

5. The method of claim 1, wherein the charge gain errors and the charge loss errors are caused by voltage shifts between two adjacent voltage levels.

6. The method of claim 1, wherein the memory cell is a multi-level memory cell having at least $2^n$ voltage levels, each voltage level corresponding to $n \geq 2$ data bits and an offset for each voltages level is determined independently of offsets for other voltage levels.

7. The method of claim 6, wherein determining the $V_T$ offset comprises determining the $V_T$ offset for each of the plurality of $V_T$ values.

8. The method of claim 1, further comprising:
determining a number of program/erase cycles of the memory unit; and
determining the $V_T$ offset using the ratio of the error type differential and the $V_T$ offset error differential in response to the number of program/erase cycles being below a predetermined value.

9. The method of claim 1, further comprising:
determining a number of program/erase cycles of the memory unit; and
determining the $V_T$ offset using a first process that includes using the ratio of the error type differential and the $V_T$ offset error differential in response to the number of program/erase cycles being below the predetermined value; and
determining the $V_T$ offset using a second process different from the first process in response to the number of program/erase cycles being above the predetermined threshold.

10. The method of claim 1, further comprising reading a reference pattern stored in the memory unit, wherein determining the predominant error type comprises determining the predominant error type using the reference pattern.

11. The method of claim 1, further comprising:
determining whether a number of complex errors are greater than at least one of the number of charge loss errors and the number of charge gain errors, wherein the charge gain errors and the charge loss errors are caused by voltage shifts between two adjacent voltage levels of a memory cell and the complex errors are caused by voltage shifts between two non-adjacent voltage levels of a memory cell; and
determining the $V_T$ offset using the ratio of the error type differential and the $V_T$ offset error differential in response to the number charge gain errors and the number of charge loss errors being greater than the number of complex errors.

12. The method of claim 11, further comprising determining the $V_T$ offset using a different process than using the ratio of the error type differential and the $V_T$ offset error differential in response to the number of complex errors being greater than at least one of the number of charge loss errors and the number of charge gain errors.

13. A memory controller, comprising:
a memory interface configured to receive data read from a unit of multi-level memory cells;
decoder circuitry configured to determine errors in the data; and
a voltage threshold analyzer configured to:
identify a predominant type of error of a memory unit of solid state memory cells;
calculate an error type differential, the error type differential comprising a difference between a number of charge loss errors and a number of charge gain errors of the memory unit;
calculate a $V_T$ offset error differential, the $V_T$ offset error differential comprising a difference between a number of errors of the predominant type at a first $V_T$ offset and a number of errors of the predominant type at a second $V_T$ offset; and
determine a $V_T$ offset using a ratio of the error type differential and the $V_T$ offset error differential.

14. The memory controller of claim 13, wherein:
the memory interface is configured to read data stored in the memory cells;
the voltage threshold analyzer is configured to:
count the number of charge loss errors in the data that are due to memory cell charge loss;
count the number of charge gain errors in the data that are due to memory cell charge gain; and
compare the number of charge loss errors to the number of charge gain errors.

15. The memory controller of claim 13, wherein the charge gain errors and the charge loss errors are caused by voltage shifts between two adjacent voltage levels.

16. The memory controller of claim 13, wherein:
the memory cells are multi-level memory cells having at least $2^n$ voltage levels, each voltage level corresponding to $n \geq 2$ data bits; and
the voltage threshold analyzer is configured to determine an optimal $V_T$ offset for each of the plurality of voltage levels.

17. The memory controller of claim 13, further comprising:
a program/erase cycle counter configured to determine a number of program/erase cycles of the memory unit; and
wherein the voltage threshold analyzer is configured to determine the $V_T$ offset using the ratio of the error type differential and the $V_T$ offset error differential in response to the number of program/erase cycles being below a predetermined value.

18. The memory controller of claim 13, wherein:
the decoder circuitry is configured to determine errors using a reference pattern read from the memory unit; and
the voltage threshold analyzer is configured to determine the predominant error type using the reference pattern.

19. The memory controller of claim 13, wherein the voltage threshold analyzer is configured to:
determine whether a number of complex errors are greater than at least one of the number of charge loss errors and the number of charge gain errors, wherein the charge gain errors and the charge loss errors are caused by voltage shifts between two adjacent voltage levels of a memory cell and the complex errors are caused by voltage shifts between two non-adjacent voltage levels of a memory cell; and
determine the $V_T$ offset using the ratio of the error type differential and the $V_T$ offset error differential in response to the number charge gain errors and the number of charge loss errors being greater than the number of complex errors.

20. The memory controller of claim 19, wherein the voltage threshold analyzer is configured to determine the $V_T$ offset using a different process than using the ratio of the error type differential and the $V_T$ offset error differential in response to the number of complex errors being greater than at least one of the number of charge loss errors and the number of charge gain errors.

\* \* \* \* \*